United States Patent
Williams et al.

(10) Patent No.: US 9,455,766 B2
(45) Date of Patent: Sep. 27, 2016

(54) RADIO FREQUENCY LEAKAGE DETECTION IN A CABLE PLANT

(71) Applicant: Cable Television Laboratories, Inc., Louisville, CO (US)

(72) Inventors: Thomas H. Williams, Louisville, CO (US); Colin Justis, Superior, CO (US)

(73) Assignee: Cable Television Laboratories, Inc, Louisville, CO (US)

( * ) Notice: Subject to any disclaimer, the term of this patent is extended or adjusted under 35 U.S.C. 154(b) by 0 days.

(21) Appl. No.: 14/812,916

(22) Filed: Jul. 29, 2015

(65) Prior Publication Data

US 2016/0036492 A1 Feb. 4, 2016

Related U.S. Application Data

(60) Provisional application No. 62/030,345, filed on Jul. 29, 2014, provisional application No. 62/054,529, filed on Sep. 24, 2014, provisional application No. 62/146,848, filed on Apr. 13, 2015.

(51) Int. Cl.
| | |
|---|---|
| *H04B 3/46* | (2015.01) |
| *H04B 1/16* | (2006.01) |
| *G01R 31/08* | (2006.01) |
| *G01S 5/02* | (2010.01) |
| *G01R 31/02* | (2006.01) |

(52) U.S. Cl.
CPC ............. *H04B 3/46* (2013.01); *G01R 31/083* (2013.01); *G01S 5/02* (2013.01); *H04B 1/16* (2013.01); *G01R 31/025* (2013.01); *G01R 31/08* (2013.01)

(58) Field of Classification Search
CPC .. G01R 31/083; G01R 31/08; G01R 31/025; Y04S 10/522; H04N 17/00; H04H 20/78; H04B 3/46; H04B 1/16; G01S 5/02
See application file for complete search history.

(56) References Cited

U.S. PATENT DOCUMENTS

| | | | | | |
|---|---|---|---|---|---|
| 4,276,509 | A * | 6/1981 | Bryant | ................. | G01R 31/026 324/505 |
| 5,294,937 | A * | 3/1994 | Ostteen | ................... | H04N 17/00 324/326 |
| 5,777,662 | A * | 7/1998 | Zimmerman | .......... | H04N 17/00 348/180 |
| 6,005,518 | A * | 12/1999 | Kallina | .............. | G01R 29/0814 324/527 |
| 6,833,859 | B1 * | 12/2004 | Schneider | .......... | G01R 29/0814 348/192 |
| 6,867,596 | B1 * | 3/2005 | Mizuno | ................ | G01R 31/021 324/521 |
| 7,788,050 | B2 * | 8/2010 | Williams | ............... | H04N 17/00 702/59 |
| 8,650,605 | B2 * | 2/2014 | Zinevich | .......... | H04N 21/44209 348/180 |
| 9,021,539 | B2 * | 4/2015 | Stelle, IV | ................ | H04B 3/32 702/59 |
| 2011/0043640 | A1 * | 2/2011 | Zinevich | ................... | G01S 5/06 348/192 |

* cited by examiner

*Primary Examiner* — Sophia Vlahos
(74) *Attorney, Agent, or Firm* — Duft Bornsen & Fettig LLP

(57) ABSTRACT

Embodiments described provide detection of RF leaks in a coaxial cable of a cable plant. One embodiment comprises a mobile device that includes an antenna, a quadrature demodulator, and a controller. The antenna receives an RF signal from an RF leak in the coaxial cable. The quadrature demodulator demodulates the RF signal to generate IQ data. The controller determines changes in a phase angle of the RF signal based on the IQ data generated as the mobile device is in motion, and identifies that the mobile device is travelling toward the RF leak responsive to determining that the phase angle is advancing. The controller identifies that the mobile device is travelling away from the RF leak responsive to determining that the phase angle is retarding.

14 Claims, 16 Drawing Sheets

RADIO FREQUENCY LEAKAGE DETECTION IN A CABLE PLANT

CROSS REFERENCE TO RELATED APPLICATIONS

This document claims priority to, and thus the benefit of an earlier filing date from, U.S. Provisional Patent Application No. 62/030,345 (filed Jul. 29, 2014) entitled "LOCATING/IDENTIFYING CABLE PLANT ISSUES", U.S. Provisional Patent Application No. 62/054,529 (filed Sep. 24, 2014) entitled "VARIOUS COMMUNICATION SYSTEMS AND METHODS", and U.S. Provisional Patent Application No. 62/146,848 (filed on Apr. 13, 2015) entitled "SIGNAL LEAKAGE DETECTION USING SYNTHETIC PHASED ARRAYS", all of which are hereby incorporated by reference.

FIELD

This disclosure relates to the field of Radio Frequency (RF) signal detection, and in particular, to detecting RF leaks from a cable plant of a cable system operator.

BACKGROUND

Cable system operators use Radio Frequency (RF) signals transmitted over coaxial cables to provide television and data services to customers. Normally these RF signals do not cause interference when in compliance with Federal Communication Commission (FCC) rules that limit interference. However, in some cases the RF signals can leak. Cable signal leaks occur when the RF signals transmitted within the cable system are not contained within the cable plant. Cable signal leaks may be caused by loose connectors, damaged cables, unshielded housings, or unterminated cables.

A cable plant uses many of the same frequencies to transmit programming as licensed to over-the-air broadcasters. Cable operators are considered by the FCC to be secondary users of these frequencies, so they are precluded from interfering with licensed users who are the primary users of these frequencies.

Cable signal leakage can interfere with the over-the-air services that are using the same frequencies as the cable plant near the vicinity of an RF leak. This can interfere with ham radio operators, cellular radio, emergency responders, and aircraft navigation systems. When interference from the cable plant occurs, it can hamper or endanger others.

The FCC has set maximum individual signal leakage levels for cable systems. The FCC is stricter with signal leakage levels for cable systems that interfere with aeronautical and/or navigation communications. Therefore, the FCC requires cable operators to have a periodic, on-going program to inspect, locate, and repair RF leaks in their cable plants. However, locating RF leaks in a cable plant can be difficult and time consuming, due to the complexity and size of a typical cable plant.

SUMMARY

Embodiments described herein provide for the detection of RF leaks in a coaxial cable of a cable plant utilizing various analytical techniques that are applied to the RF signals emitted from the RF leaks. These analytical techniques provide information about an RF leak that reduces the amount of effort and time that may be required to locate the RF leak in the cable plant.

One embodiment comprises a mobile device that is configured to detect RF leaks emanating from a coaxial cable of a cable plant. The mobile device includes an antenna that is configured to receive an RF signal from an RF leak in the coaxial cable. The mobile device further includes a quadrature demodulator that is configured to demodulate the RF signal to generate In-phase and Quadrature (IQ) data, and a controller. The controller is configured to determine changes in a phase angle of the RF signal based on the IQ data generated as the mobile device is in motion. The controller is further configured to identify that the mobile device is travelling toward the RF leak responsive to determining that the phase angle is advancing, and to identify that the mobile device is travelling away from the RF leak responsive to determining that the phase angle is retarding.

Another embodiment comprises a method for detecting RF leaks emanating from a coaxial cable of a cable plant. The method comprises receiving, by an antenna of a mobile device, an RF signal from an RF leak in the coaxial cable. The method further comprises demodulating the RF signal to generate IQ data, and determining changes in a phase angle of the RF signal based on the IQ data generated as the mobile device is in motion. The method further comprises identifying that the mobile device is travelling towards the RF leak responsive to determining that the phase angle is advancing, and identifying that the mobile device is travelling away from the RF leak responsive to determining that the phase angle is retarding.

Another embodiment is a non-transitory computer readable medium embodying programmed instructions which, when executed by a processor of a mobile device, detects RF leaks emanating from a coaxial cable of a cable plant. The instructions direct the processor to receive, by an antenna of the mobile device, an RF signal from an RF leak in the coaxial cable. The instructions further direct the processor to demodulate the RF signal to generate IQ data, and to determine changes in a phase angle of the RF signal based on the IQ data generated as the mobile device is in motion. The instructions further direct the processor to identify that the mobile device is traveling towards the RF leak responsive to determining that the phase angle is advancing. The instructions further direct the processor to identify that the mobile device is traveling away from the RF leak responsive to determining that the phase angle is retarding.

The above summary provides a basic understanding of some aspects of the specification. This summary is not an extensive overview of the specification. It is intended to neither identify key or critical elements of the specification nor delineate any scope particular embodiments of the specification, or any scope of the claims. Its sole purpose is to present some concepts of the specification in a simplified form as a prelude to the more detailed description that is presented later.

DESCRIPTION OF THE DRAWINGS

Some embodiments are now described, by way of example only, and with reference to the accompanying drawings. The same reference number represents the same element or the same type of element on all drawings.

DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
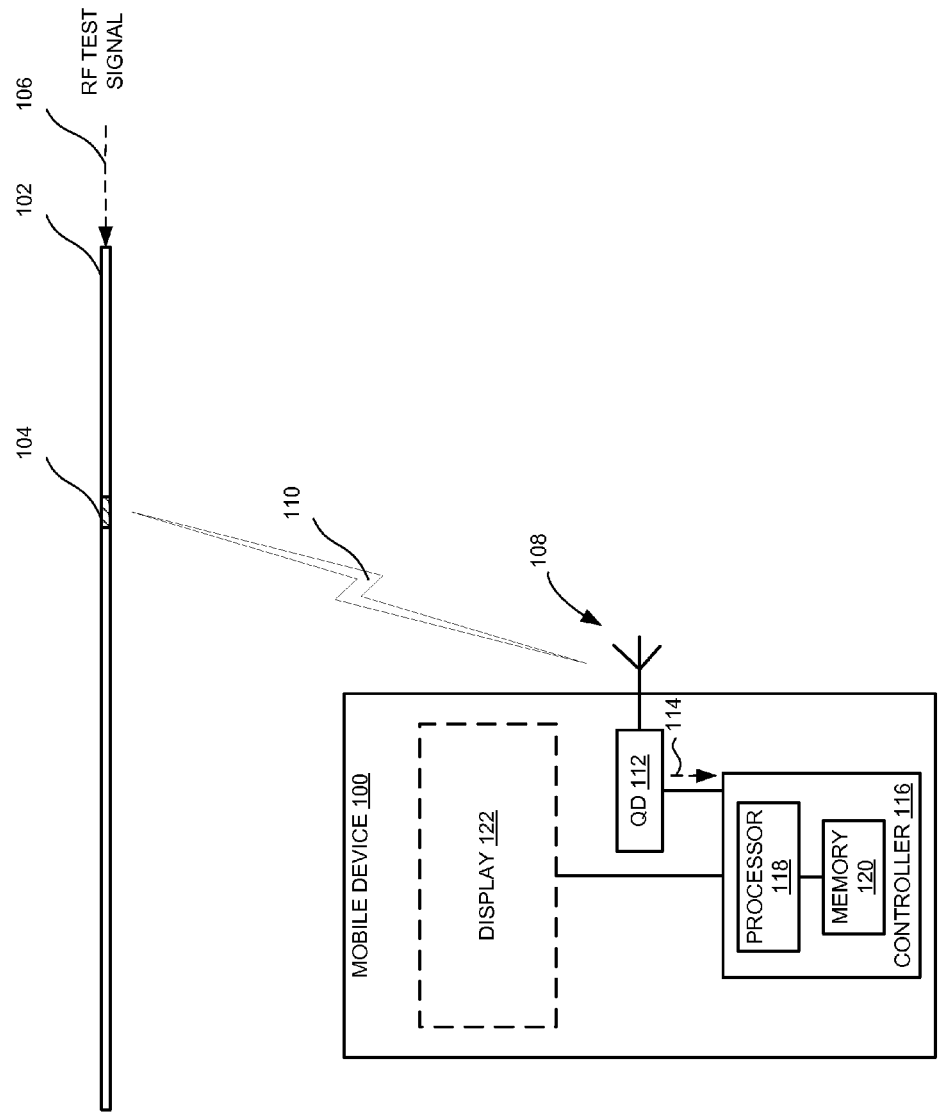
FIG. 1 is a block diagram of a mobile device that detects RF leaks emanating from a coaxial cable of a cable plant in an exemplary embodiment.

FIG. 1 is a block diagram of a mobile device 100 that detects RF leaks emanating from a coaxial cable of a cable plant in an exemplary embodiment. For purposes of discussion, a coaxial cable 102 is illustrated in FIG. 1 that is part of a cable plant. Coaxial cable 102 includes an inner conductor (not shown) that is surrounded by a tubular insulation layer (not shown). The tubular insulation layer is surrounded by a tubular outer shield (not shown).

In this embodiment, coaxial cable 102 is utilized by a cable operator to distribute television and/or data services to customers. Cable operators typically transmit using some of the same frequencies over coaxial cables (e.g., coaxial cable 102) that are licensed for over-the-air broadcasts. For instance, a cable plant may utilize frequencies of up to about 1 gigahertz (GHz), which may interfere (if there are RF leaks) with any number of critical radio services in the US, such as local fire departments (154.28 MHz), local and state search and rescue (155.160 MHz), National Guard (163.4875 MHz), the US Air Force (311.00 MHz), and many others.

To prevent the cable plant from interfering with licensed spectrum, the FCC requires that cable operators routinely inspect their cable plants to determine if any RF leaks are present. For purposes of discussion, coaxial cable 102 in FIG. 1 is illustrated with an RF leak 104 that is detectable by mobile device 100.

RF leak 104 may be caused by damage to coaxial cable 102. Some examples of the types of damage that may occur at coaxial cable 102 include broken tubular outer shields, loose connectors, damaged RF gaskets on housings, etc. In this embodiment RF leak 104 generates an RF signal 110, which corresponds with an RF test signal 106 that is transmitted along coaxial cable 102. RF test signal 106 may be a Continuous Wave (CW) test signal in some embodiments. For instance, RF test signal 106 may be an 800 megahertz (MHz) CW signal that is injected along coaxial cable 102 to allow mobile device 100 to detect RF leak 104. However, 800 MHz is just one possible frequency that may be transmitted along coaxial cable 102, with other options being any frequency that may be supported by the bandwidth of coaxial cable 102. In some embodiments, RF test signal 106 may include pilot signals that are used for automatic gain and slope control of data signals transmitted by coaxial cable 102. RF test signal 106 may also include data signals utilized by a cable plant to provide television and/or data services to customers in some embodiments.

In this embodiment, mobile device 100 includes an antenna 108 that is capable of receiving RF signal 110 that is generated by RF leak 104. Antenna 108 includes any electrical device that is able to convert RF signal 110 into an electrical current and/or voltage. Mobile device 100 also includes a quadrature demodulator (QD) 112, that generates IQ data 114. Quadrature demodulation is sometimes referred to as IQ demodulation, or complex demodulation. QD 112 demodulates RF signal 110, and generates both an in-phase component (I) and a quadrature component (Q) of RF signal 110 relative to a frequency source (not shown) used for demodulation. For instance, if RF test signal 106 is a 800 MHz CW test signal, then the QD 112 may utilize an 800 MHz frequency source to demodulate RF signal 110 and generate IQ data 114, which would represent changes in the phase and magnitude of RF signal 110. QD 112 in this embodiment includes any electronic device that is able to demodulate RF signal 110, and to generate both an in-phase and a quadrature component for RF signal 110.

IQ data 114 is proved to a controller 116, which is able to analyze IQ data 114 to enable mobile device 100 to detect information about RF leak 104. For instance, controller 116 may be able to analyze IQ data 114 to identify whether mobile device 110 is moving toward or away from RF leak 104, may be able to analyze IQ data 114 to determine a bearing and/or a location of RF leak 104, may be able to analyze IQ data 114 to identify frequency shifts in RF signal 110 etc. To do so, controller 116 may utilize any electronic device that is capable of performing such functionality. While the specific hardware implementation of controller 116 is subject to design choices, one particular embodiment may include one or more processors 118 coupled with a memory 120. Processor 118 includes any electronic device that is able to perform functions. Processor 118 may include one or more Central Processing Units (CPU), microprocessors, Digital Signal Processors (DSPs), Application-specific Integrated Circuits (ASICs), etc. Some examples of processors include Intel® Core™ processors, ARM® processors, etc.

Memory 120 includes any electronic device that is able to store data. For instance, memory 120 may store IQ data 114 during processing. Memory 120 may include one or more volatile or non-volatile Dynamic Random Access Memory (DRAM) devices, FLASH devices, volatile or non-volatile Static RAM devices, hard drives, Solid State Disks (SSDs), etc. Some examples of non-volatile DRAM and SRAM include battery-backed DRAM and battery-backed SRAM.

Mobile device 100 in some embodiments includes a display 122, which allows a user (not shown in FIG. 1) to interact visually with mobile device 100. Display 122 includes any electronic device that is capable of displaying information to a user. One example of display 122 includes a Liquid Crystal Display (LCD), which may include a touch interface that allows the user to control mobile device 100.

Consider that a user is in the field with mobile device 100, and is attempting to locate RF leak 104 in coaxial cable 102. RF test signal 106 is transmitted along coaxial cable 102 during the testing process. RF test signal 106 may be introduced at a downstream portion of the cable plant relative to coaxial cable 102, may include pilot or training signals utilized by the cable plant, and/or may include data signals provided by the cable plant to customers.

Figure 2:
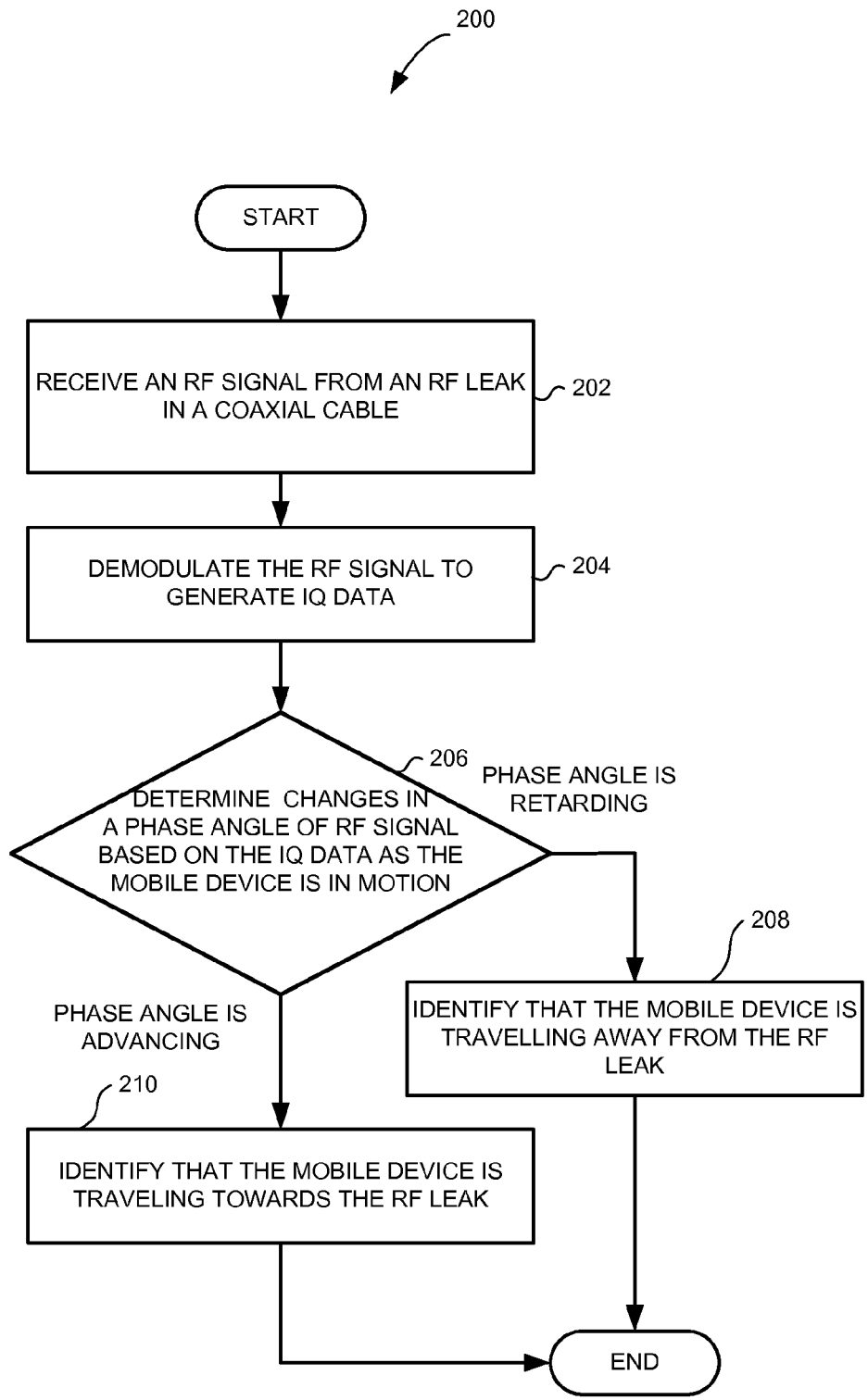
FIG. 2 is flow chart of a method for detecting RF leaks emanating from a coaxial cable of a cable plant in an exemplary embodiment.

FIG. 2 is flow chart of a method 200 for detecting RF leaks emanating from a coaxial cable of a cable plant in an exemplary embodiment. Method 200 will be discussed with respect to mobile device 100, although method 200 may be performed by other systems, not shown. The steps of the flow charts described herein may include other steps that are not shown. Also, the steps of the flow charts described herein may be performed in an alternate order.

Mobile device 100 begins the testing phase of coaxial cable 102 by receiving RF signal 110 at antenna 108 (see step 202 of FIG. 2). To do so, a user may carry mobile device 100 proximate to coaxial cable 102, a user may be driving nearby coaxial cable 102 with mobile device 100 in a vehicle, etc. The RF signal 110 is demodulated by QD 112 to generate IQ data 114, which is provided to processor 118 of controller 116. In some embodiments, RF test signal 106 may comprise a CW test signal at a known frequency. In this case, QD 112 may use a reference source at the known frequency to demodulate RF signal 110, with IQ data 114 representing the in-phase (I) and quadrature (Q) differences between RF signal 110 and the source. In other embodiments, RF test signal 106 may comprise a broadband test signal having a pre-determined pattern. For instance, RF test signal 106 may comprise pre-defined Orthogonal Frequency Division Multiplexed (OFDM) test patterns, such as pilot subcarriers used in Data Over Cable Service Interface Specification (DOSCIS®) used by a customer's cable modem to adapt to changing channel conditions.

Processor 118 analyzes IQ data 114, and determines changes in a phase angle of RF signal 110 generated as mobile device 100 is in motion (see step 206). For instance, processor 118 may monitor changes in the phase angle as the user carries mobile device 100 along coaxial cable 102. Changes to the phase angle result from mobile device 100 moving with respect to RF leak 104. For instance, if RF test signal 106 is an 800 MHz CW signal, then a wavelength of RF signal 110 generated by RF leak 104 is about 37.5 centimeters (cm). As mobile device 100 is moved closer to RF leak 104, the phase angle of RF signal 110 advances. For example, if mobile device 100 is moved 10 cm directly towards RF leak 104, then processor 118 would be able to determine that the phase angle of RF signal 110 advances by about (10/37.5)*360 degrees, or about 96 degrees. In like manner, if mobile device 100 is moved 10 cm directly away from RF leak 104, then processor 118 would be able to determine that the phase angle of RF signal 110 is retarding by about 96 degrees. However, it is not necessary that mobile device 100 be traveling directly toward or away from RF leak 104 in order to identify changes in the phase angle of RF signal 110.

If processor 118 determines that the phase angle of RF signal 110 is retarding, then processor 118 will identify that mobile device 100 is traveling away from RF leak 104 (see step 208). For instance, processor 118 may indicate such on display 122 in some embodiments. If processor 118 determines that the phase angle of RF signal 110 is advancing, then processor 118 will identify that mobile device 100 is traveling towards RF leak 104 (see step 210). For instance, processor 118 may indicate such on display 122 in some embodiments.

Accurately identifying small changes in the phase angle of RF signal 110 may depend upon a number of factors, including the stability of the frequency of RF test signal 106, the stability of the source frequency used by QD 112 to demodulate RF signal 110, etc. Therefore, mobile device 100 may include a highly stable frequency source. For instance, mobile device 100 may include a Rubidium-based frequency standard and/or an oscillator locked to a Global Positioning System (GPS) signal, which may be used by QD 112 to demodulate RF signal 110.

Figure 3:
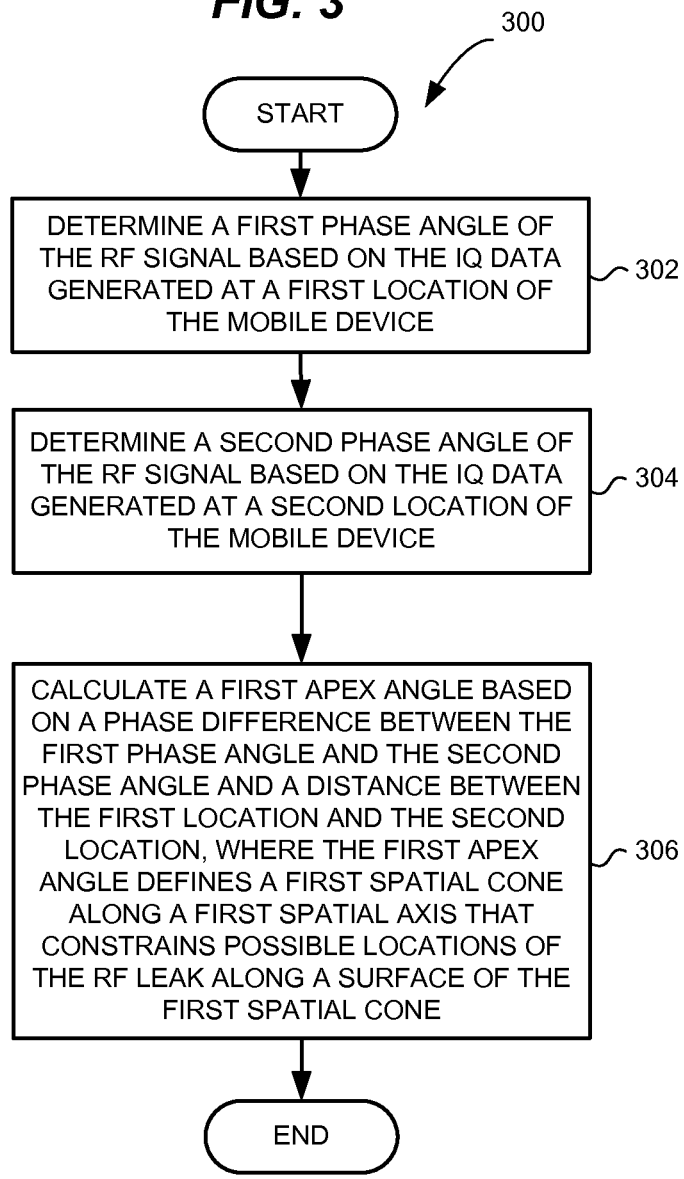
FIG. 3 is a flow chart of another method for detecting an RF leak emanating from a coaxial cable plant in an exemplary embodiment.

FIG. 3 is a flow chart of another method 300 of detecting an RF leak emanating from a coaxial cable plant in an exemplary embodiment. Method 300 will be discussed with respect to mobile device 100, although method 300 may be performed by other systems, not shown. In this embodiment, information about RF leak 104 can be determined by determining phase changes in RF signal 110 when mobile device 100 changes locations and constraining possible bearings to RF leak 104 based on a relationship between changes in the phase angle and the distance between the locations.

Consider that mobile device 100 is located at a first location, which for purposes of discussion is the origin (0,0) of an x-y coordinate system. Starting at the origin, if mobile device 100 is moved along the x-axis a small incremental amount Δx, then an angle $\theta_1$ can be computed which will describe a first spatial cone along the x-axis in 3-dimensions. An apex angle of the first spatial cone will be twice $\theta_1$, and will be at the origin. $\theta_1$ is calculated based on a relationship between the actual phase change of RF signal 110 between (0,0) and (0+Δx, 0), and the phase change that would be expected if mobile device 100 was moved directly towards RF leak 104.

Figure 4:
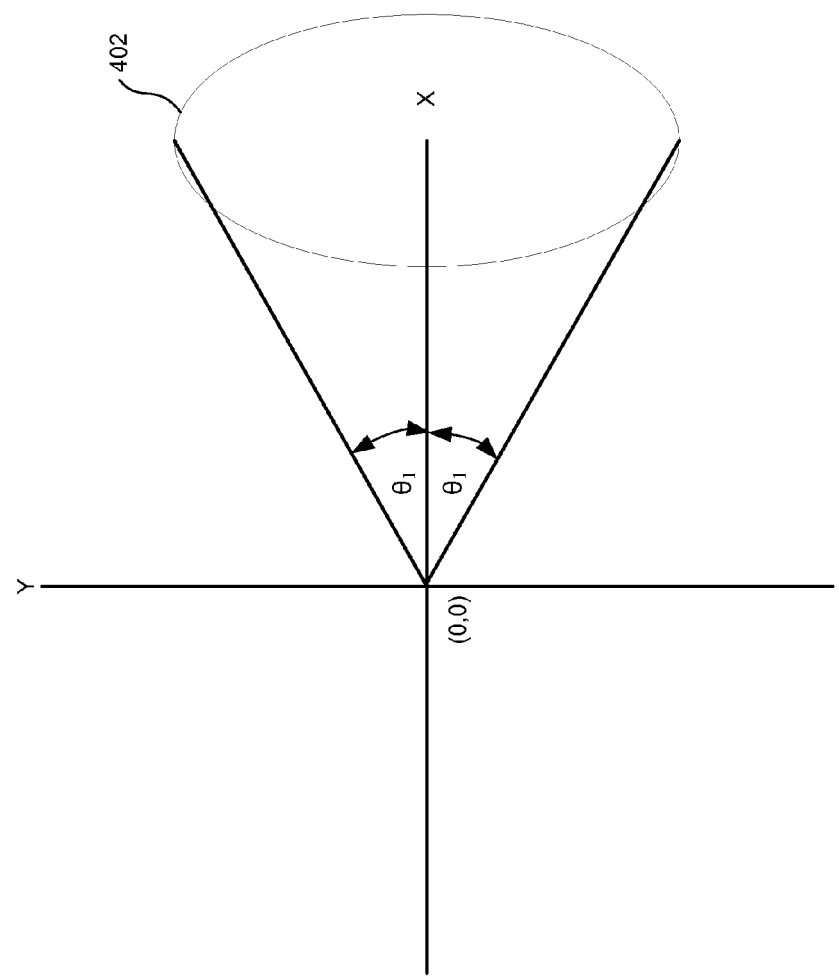
FIG. 4 illustrates a first spatial cone along an x-axis in an exemplary embodiment.

Processor 118 analyzes IQ data 114 generated at a first location (0,0) to determine a first phase angle of RF signal 110 based on IQ data 114 generated at the first location (see step 302 of FIG. 3). Mobile device 100 is moved to a second location (0+Δx, 0), and processor 118 determines a second phase angle of RF signal 110 based on IQ data 114 generated at the second location (see step 304). The distance between the origin (0,0) and (0+Δx, 0) can be determined by mobile device 100 (e.g., utilizing an accelerometer, GPS signals, etc.), and used to calculate an expected phase shift in RF signal 110 that would occur if RF leak 104 were located along the x-axis. For instance, if RF test signal 106 is an 800 MHz CW test signal, then the wavelength would be 37.5 cm. Therefore, one would expect that if mobile device 100 was moved 37.5 cm along the x-axis, that a phase rotation between the first phase determined at (0,0) and the second phase determined at (0+Δx, 0) would be 360 degrees. If the phase difference between (0,0) and (0+Δx, 0) were instead only 270 degrees, then $\theta_1$ is related to 270/360. In particular, $\theta_1$ may be calculated as the Arc cosine of (270/360), which is 41.4 degrees. The apex angle of the first spatial cone is therefore $2\theta_1$, or 82.8 degrees, which is calculated based on the phase difference and the distance between the first location and the second location (see step 306). A first spatial cone 402 is illustrated in FIG. 4, which is located at (0,0) and lies along the x-axis. The apex angle for first spatial cone 402 is $2\theta_1$, and RF leak 104 lies along a surface generated by first spatial cone 402. First spatial cone 402 therefore confines possible locations of RF leak 104 to its surface. Similar calculation can be performed along the y-axis to generate a second spatial cone and the z-axis to generate a third spatial cone that further constrains the possible locations of RF leak 104.

Figure 5:
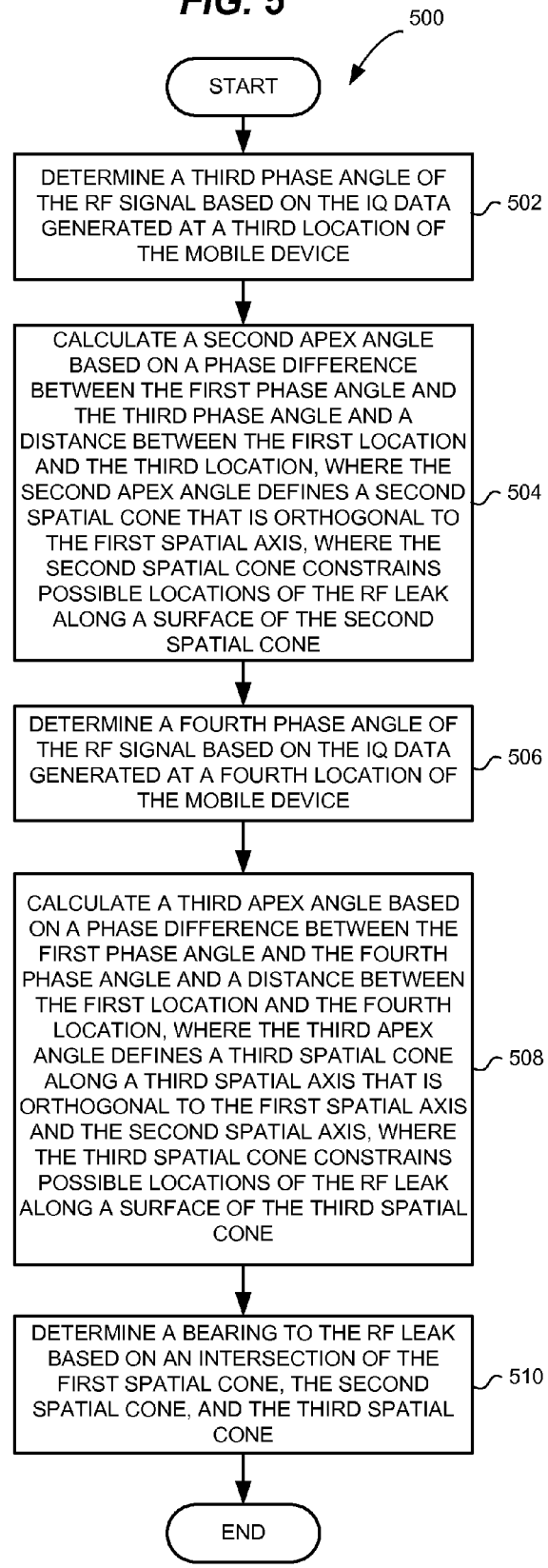
FIG. 5 is a flow chart of a method of determining a bearing to an RF leak emanating from a coaxial cable of a cable plant in an exemplary embodiment.

FIG. 5 is a flow chart of a method 500 of determining a bearing to an RF leak emanating from a coaxial cable of a cable plant in an exemplary embodiment. Method 500 will be discussed with respect to mobile device 100, although method 500 may be performed by other systems, not shown.

Starting at the origin (0,0), if mobile device 100 is moved along the vertical y-axis a small incremental amount Δy, then an angle $\theta_2$ can be computed which will describe a second spatial cone along the y-axis in 3-dimensions. An apex angle of the second spatial cone will be twice $\theta_2$, and will be at the origin. $\theta_2$ is calculated based on a relationship between the actual phase change of RF signal 110 between (0,0) and (0, 0+Δy), and the phase change that would be expected if mobile device 100 was moved directly towards RF leak 104. In this embodiment, the y-axis is orthogonal to the x-axis, and the second spatial cone further constrains possible locations of RF leak 104 along a surface of the second spatial cone.

Figure 6:
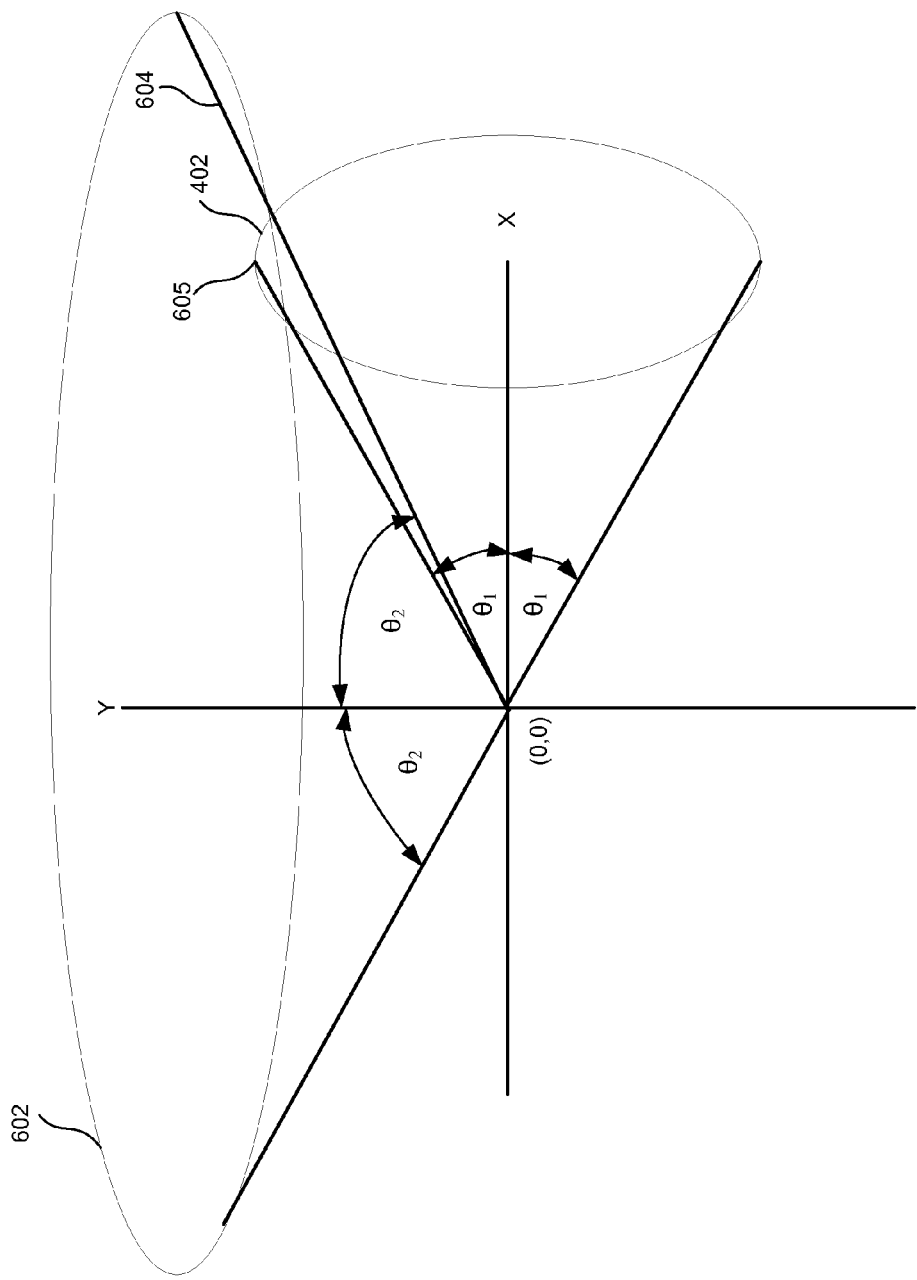
FIG. 6 illustrates a second spatial cone along a y-axis in an exemplary embodiment.

Mobile device 100 is moved to a third location (0, 0+Δy), and processor 118 determines a third phase angle of RF signal 110 based on of IQ data 114 at the third location (see step 502). The distance between the origin (0,0) and (0, 0+Δy) can be determined by mobile device 100, and used to calculate an expected phase shift in RF signal 110 that would occur if RF leak 104 were located along the y-axis. For instance, if RF test signal 106 is an 800 MHz CW test signal, then the wavelength would be 37.5 cm. Therefore, one would expect that if mobile device 100 was moved 37.5 cm along the y-axis, that a phase rotation between the first phase determined at (0,0) and the second phase determined at (0, 0+Δy) would be 360 degrees. If the phase difference between (0, 0) and (0, 0+Δy) were instead only 200 degrees, then $\theta_2$ is related to 200/360. In particular, $\theta_2$ may be calculated as the Arc cosine of (200/360), which is 56.3 degrees. The apex angle of the second spatial cone is therefore $2\theta_2$, or 102.6 degrees, which is calculated based on the phase difference and the distance between the first location and the third location (see step 504). A second spatial cone 602 is illustrated in FIG. 6. The apex angle for second spatial cone 602 is $2\theta_2$. Using the apex angles calculated for first spatial cone 402 and second spatial cone 602, processor 118 is able to determine bearings to RF leak 104 that are based on the intersection between first spatial cone 402 and second spatial cone 602, which occurs along lines 604-605 in FIG. 6. A bearing to RF leak 104 will lie on one of lines 604-605. Processor 118 may indicate bearings to RF leak 104 on display 122 in some embodiments. If the elevation along a z-axis of RF leak 104 is known, then the elevation may be used to determine which lines 604-605 are the correct bearing. If the elevation along the z-axis of RF leak 104 is not known, then which of lines 604-605 is the correct bearing to RF leak 104 can be calculated using similar techniques as described above for the x-axis and y-axis spatial cones along the z-axis.

Figure 7:
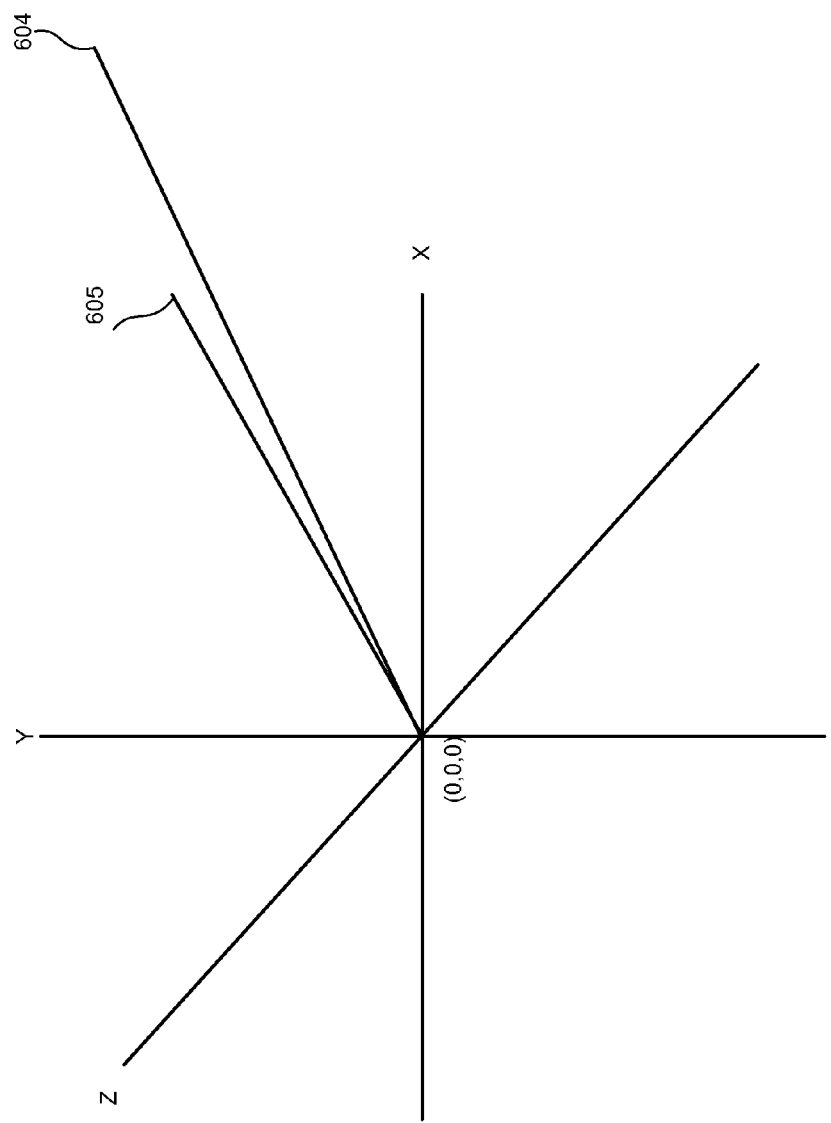
FIG. 7 illustrates two possible bearings to an RF leak in an exemplary embodiment.

Consider that mobile device 100 is located at the first location, which is the origin (0,0,0) of an x-y-z coordinate system illustrated in FIG. 7. FIG. 7 illustrates two possible bearings to an RF leak in an exemplary embodiment. First spatial cone 402 and second spatial cone 602 have been removed for clarity, leaving behind lines 604-605 that represent possible bearings to RF leak 104. Starting at the origin, if mobile device 100 is moved along the z-axis a small incremental amount Δz, then an angle $\theta_3$ can be computed which will describe a third spatial cone along the z-axis in 3-dimensions. An apex angle of the third spatial cone will be twice $\theta_3$, and will be at the origin. $\theta_3$ is calculated based on a relationship between the actual phase change of RF signal 110 between (0,0,0) and (0,0,0+Δz), and the phase change that would be expected if mobile device 100 was moved directly towards RF leak 104. In this embodiment, the z-axis is orthogonal to both the x-axis and the y-axis, and the third spatial cone further constrains possible locations of RF leak 104 along a surface of the third spatial cone.

Figure 8:
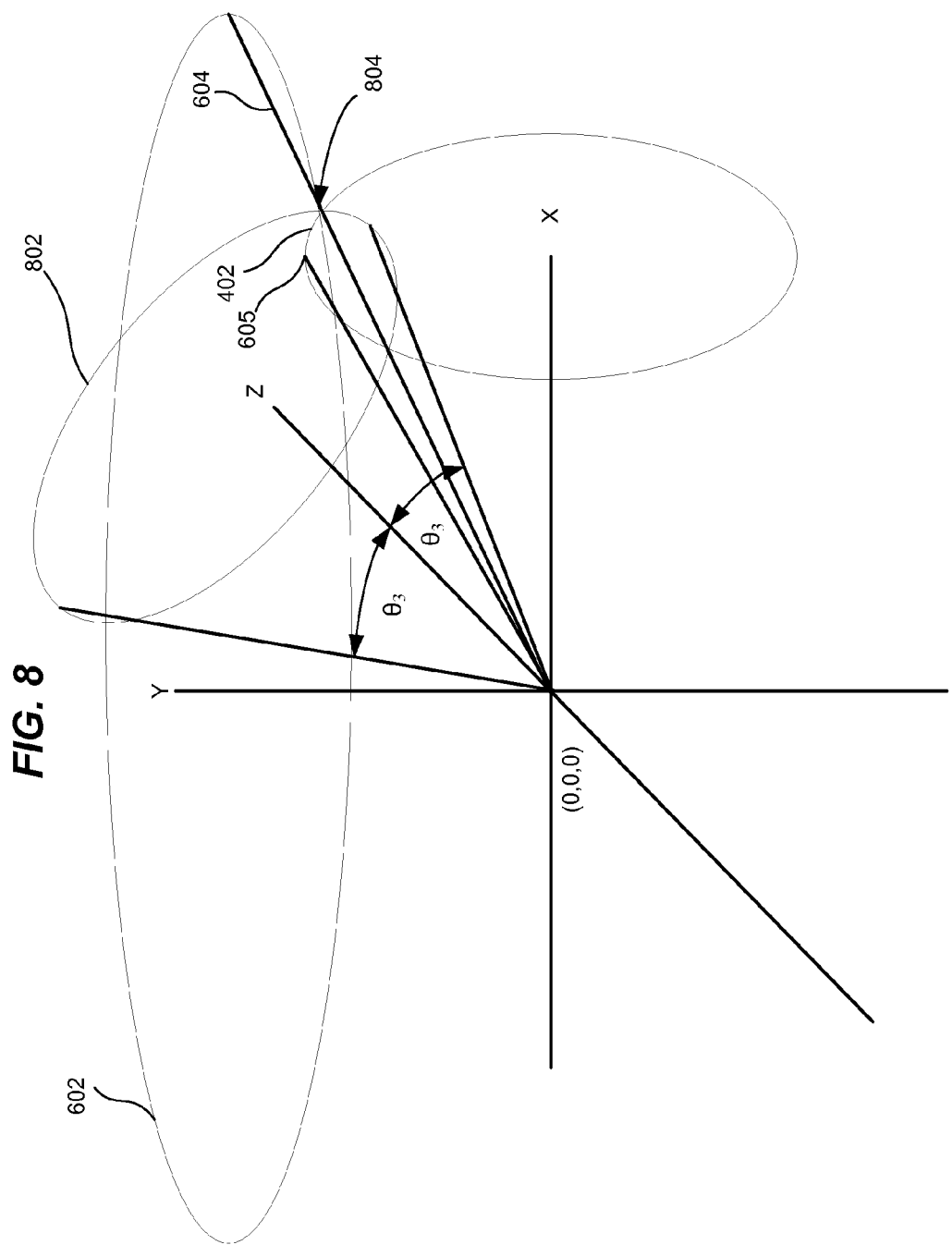
FIG. 8 illustrates a third spatial cone along a z-axis in an exemplary embodiment.

Mobile device 100 is moved to a third location (0,0,0+Δz), and processor 118 determines a fourth phase angle of RF signal 110 based on IQ data 114 at the third location (see step 506 of FIG. 5). The distance between the origin (0,0,0) and (0,0,0+Δz) can be determined by mobile device 100, and used to calculate an expected phase shift in RF signal 110 that would occur if RF leak 104 were located along the z-axis. For instance, if RF test signal 106 is an 800 MHz CW test signal, then the wavelength would be 37.5 cm. Therefore, one would expect that if mobile device 100 was moved 37.5 cm along the x-axis, that a phase rotation between the first phase determined at (0,0,0) and the fourth phase determined at (0,0,0+Δz) would be 360 degrees. If the phase difference between (0,0,0) and (0,0,0+Δz) were instead only 250 degrees, then $\theta_3$ is related to 250/360. In particular, $\theta_3$ may be calculated as the Arc cosine of (250/360), which is 46 degrees. The apex angle of the third spatial cone is therefore $2\theta_3$, or 92 degrees, which is calculated based on the phase difference and the distance between the first location and the fourth location (see step 508). A third spatial cone 802 is illustrated in FIG. 8, which is located at (0,0,0) and lies along the z-axis. The apex angle for third spatial cone 802 is $2\theta_3$, and processor 118 determines line 604 is a bearing of RF leak 104 based on an intersection 804 between first spatial cone 402, second spatial cone 602, and third spatial cone 802 (see step 510). Processor 118 may indicate the bearing on display 122 of mobile device 100 in some embodiments.

Figure 9:
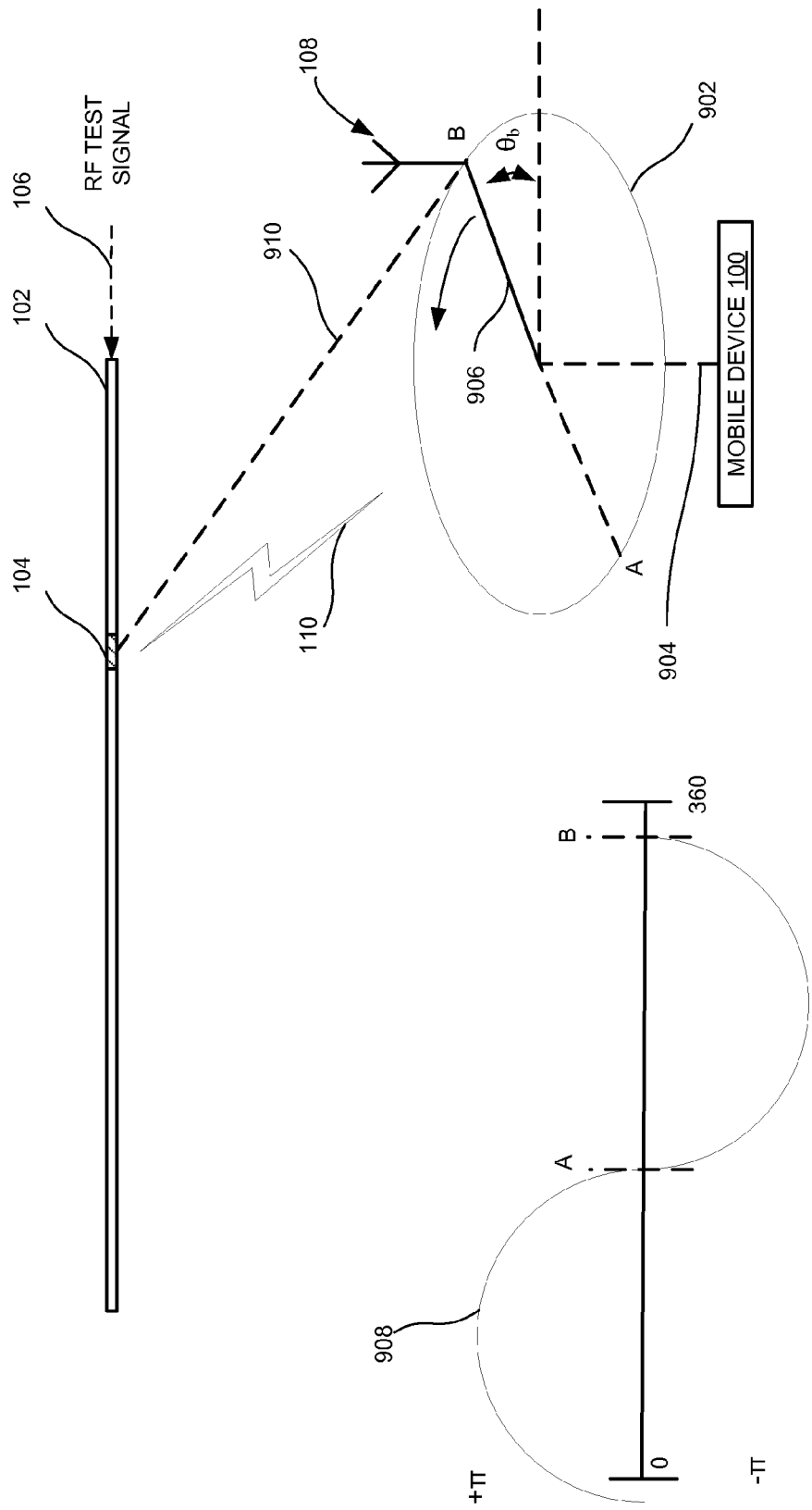
FIG. 9 illustrates the mobile device of FIG. 1 in another exemplary embodiment.
Figure 10:
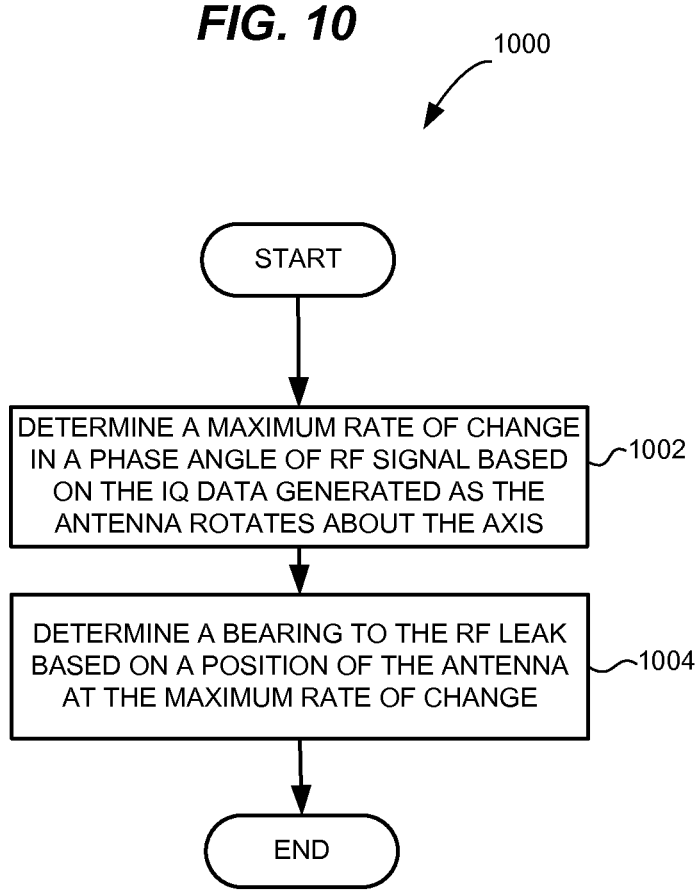
FIG. 10 is a flow chart of another method for determining a bearing to an RF leak emanating from a coaxial cable of a cable plant in an exemplary embodiment.

FIG. 9 illustrates mobile device 100 in another exemplary embodiment. In this embodiment, mobile device 100 includes a member 902 that is configured to rotate about an axis 904. In this embodiment, antenna 108 is mounted to member 902 at a radius 906 from axis 904, and rotates about axis 904 as member 902 rotates. As antenna 108 rotates in the direction indicated in the arrow in FIG. 9, a phase angle 908 of RF signal 110 advances and retards. FIG. 10 is a flow chart of another method 1000 for determining a bearing to an RF leak emanating from a coaxial cable of a cable plant in another exemplary embodiment. Processor 118 determines a maximum rate of change (e.g., the first derivative) of phase angle 908 that is generated as antenna 108 rotates about axis 904 (see step 1002 of FIG. 10). A bearing angle $\theta_b$ of RF leak 104 can be determined by processor 118 based on a position of antenna 108 at the maximum rate of change as member 902 rotates (see step 1004). A tangent from the direction of rotation at point B, where the slope of phase 908 is at a maximum, can be determined from $\theta_b$. Tangent point A will be 180 degrees opposed. A bearing from mobile device 100 to RF leak 104 may be indicated on display 122 by processor 118 in some embodiments.

Figure 11:
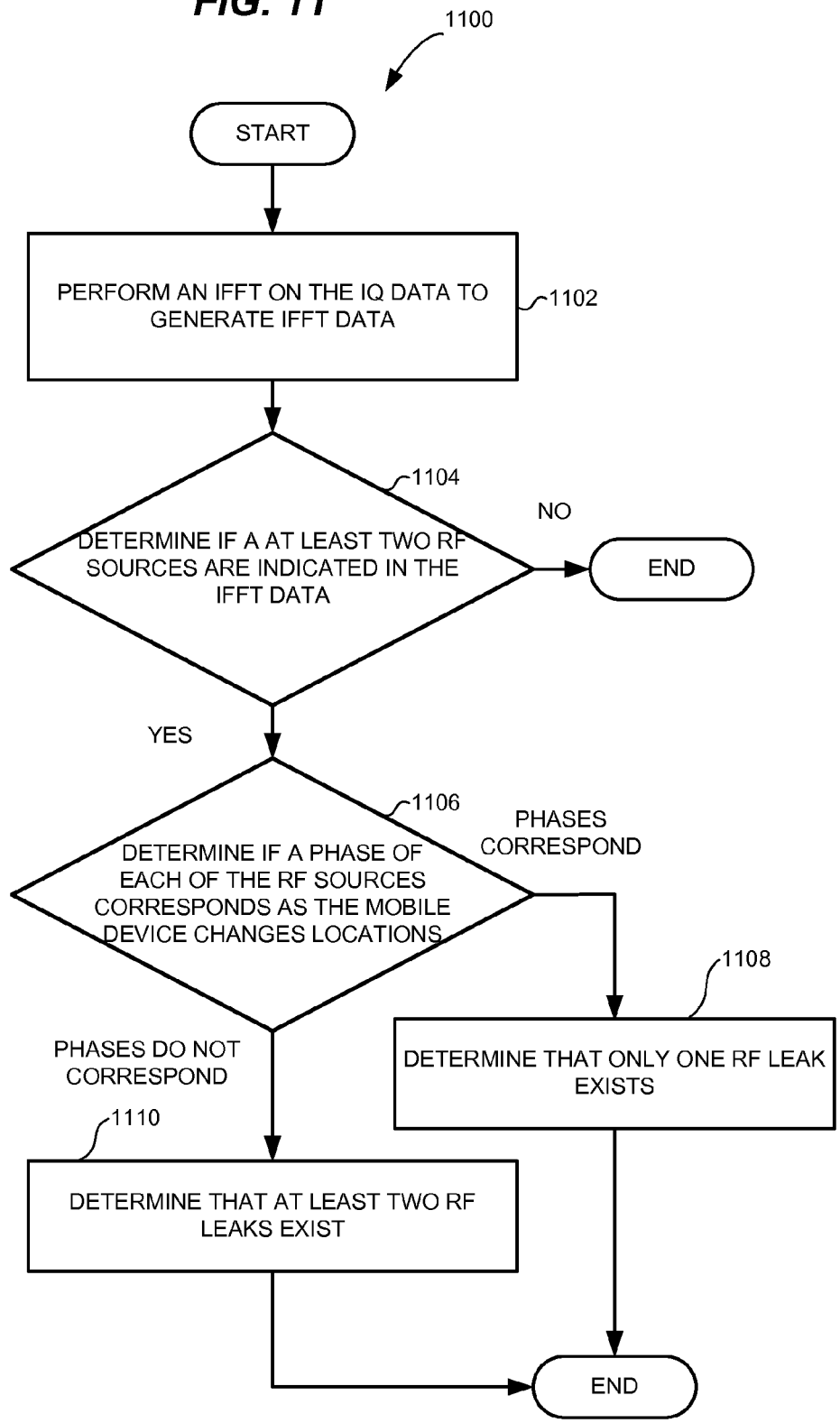
FIG. 11 is a flow chart of a method for determining if multiple RF leaks exist in a coaxial cable of a cable plant in an exemplary embodiment.

In Another embodiment, mobile device 100 performs an Inverse Fast Fourier Transform (IFFT) on IQ data 114 to generate IFFT data, and attempts to determine if multiple RF leaks are present in coaxial cable 102. FIG. 11 is a flow chart of a method 1100 for determining if multiple RF leaks exist in a coaxial cable of a cable plant in an exemplary embodiment. In this embodiment, RF test signal 106 is a wideband RF signal. Some other examples of RF test signal 106 include chirps, sin(x)/x waveforms, pseudo-noise sequences, and Zadoff-Chu sequences.

During operation, processor 118 performs an IFFT on samples of IQ data 114 to generate IFFT data (see step 1102). Processor 118 determines if at least two RF sources are indicated in the IFFT data (see step 1104). If only one RF source is indicated, then method 1100 ends. If at least two RF sources are indicated, then processor 118 determines if a phase of each of the RF sources corresponds as mobile device 100 changes locations (see step 1106). Even if two RF sources are identified in the IFFT data, one RF source may be a reflection of another RF source. If the phases correspond, then processor determines that only one RF leak exists in coaxial cable 102 (see step 1108). However, if the phases do not correspond, then processor 118 determines that at least two RF leaks exist in coaxial cable 102 (see step 1110).

In some embodiments, RF test signal 106 may DOCSIS® pilot signals that are typically transmitted by coaxial cable 102 while providing television and/or data services to customers. The pilot signals do not carry data, and are utilized to characterize the RF channel in coaxial cable 102. In another embodiment, mobile device 100 captures a full set of pilot subcarrier signals at the subcarrier frequencies of the pilot signals, and combines the pilot signals into an OFDM frame. Processor 118 is then able to perform an IFFT on IQ data 114 for the OFDM frame, which generates one or more impulse responses. If the impulses are the result of two or more RF leaks in coaxial cable 102, or the leaks have multipath issues, then the delays of the different impulses will vary from each other as mobile device 100 changes locations. If the delay changes of the individual impulses are tracked as the antenna is moved, each leak can be individually identified and a spatial cone may be created for each leak.

Figure 12:
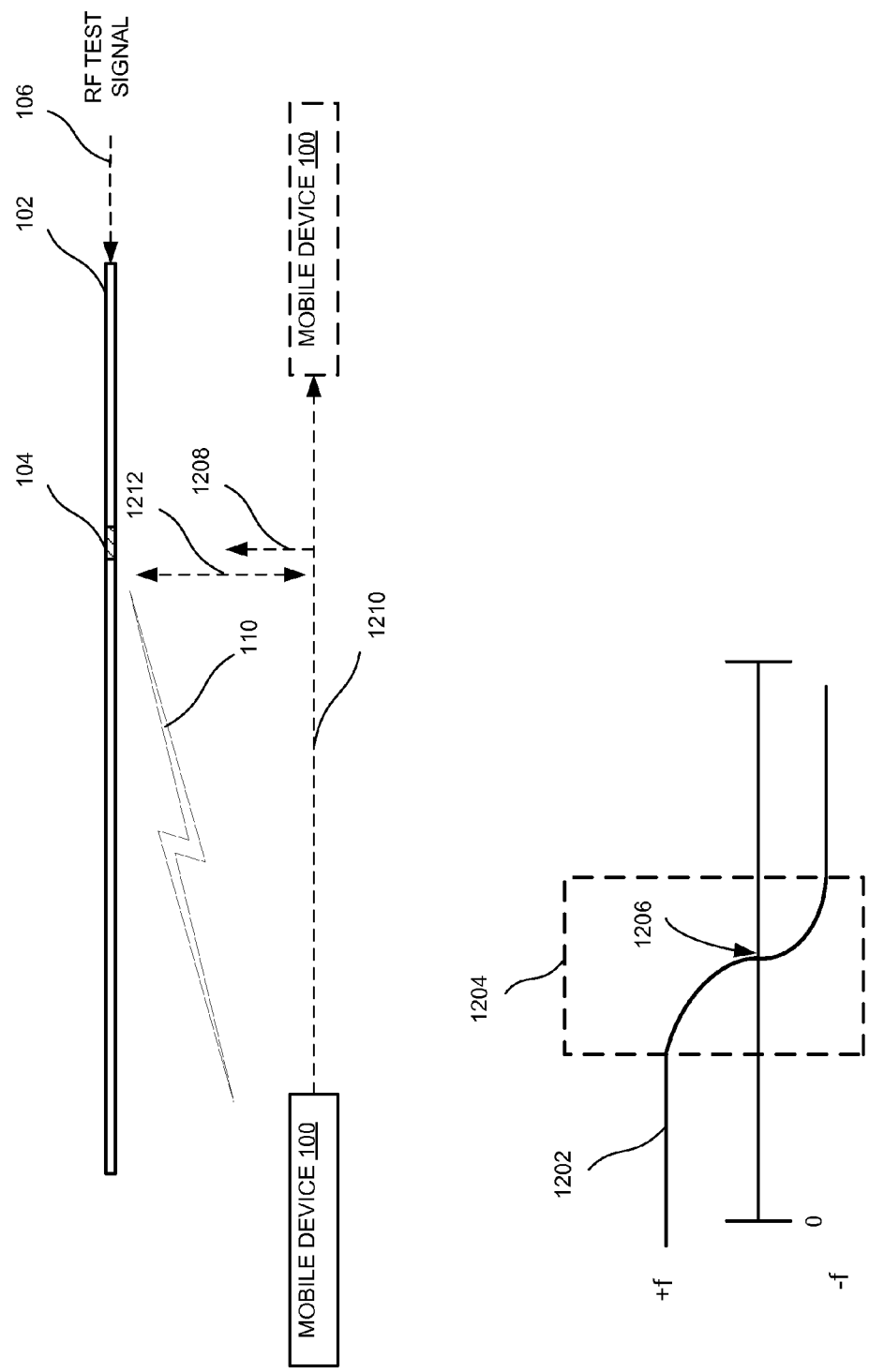
FIG. 12 is a block diagram of the mobile device of FIG. 1 in another exemplary embodiment.

FIG. 12 is a block diagram of mobile device 100 in another exemplary embodiment. In this embodiment, mobile device 100 is able to process IQ data 114 while mobile device 100 is in motion, and determine changes in a frequency 1202 of RF signal 110. For instance, mobile device 100 may be placed in a vehicle, and driven along a road that is proximate to coaxial cable 102. Changes in frequency 1202 provide information to mobile device 100 regarding whether mobile device 100 is traveling toward RF leak 104 or away from RF leak 104. In this embodiment, RF test signal 106 is a test signal at a known frequency.

Figure 13:
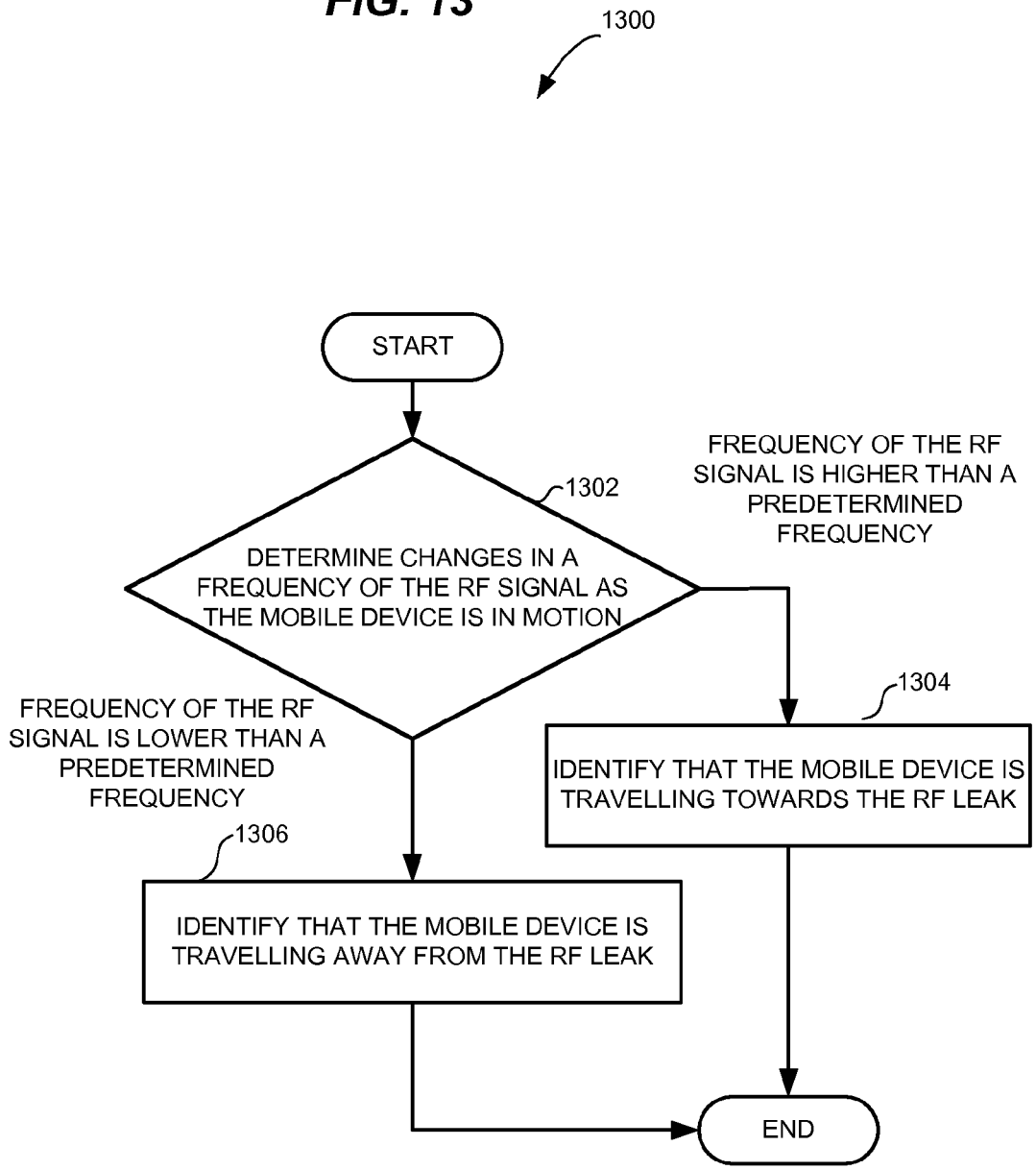
FIG. 13 is a flow chart of another method for detecting RF leaks emanating from a coaxial cable of a cable plant in an exemplary embodiment.

FIG. 13 is a flow chart of another method 1300 for detecting RF leaks emanating from a coaxial cable of a cable plant in an exemplary embodiment. Processor 118 determines changes in frequency 1202 of RF signal 110 as mobile device 100 is in motion (see step 1302). If frequency 1202 of RF signal 110 is higher than the known frequency of RF test signal 106, then processor 118 identifies that that mobile device 100 is traveling towards RF leak 104 (see step 1304). If frequency 1202 of RF signal 110 is lower than the predetermined frequency of RF test signal 106, then processor 118 identifies that mobile device 100 is traveling away from RF leak 104 (see step 1306). A distance 1212 between mobile device 100 and RF leak 104 may be estimated in some embodiments based on the rate at which frequency 1202 transitions. For example, using a slope of frequency 1202 in transition region 1204. The slope may be higher as distance 1212 decreases.

In another embodiment, mobile device 100 is capable identifying a bearing towards RF leak 104 based on a transition region 1204 of frequency 1302 of RF signal 110. As mobile device 100 transitions from travelling toward RF leak 104 to travelling away from RF leak 104, frequency 1204 of RF signal 110 changes from being higher than the known frequency of RF test signal 106 to being lower than the known frequency of RF test signal 106. Transition region 1204 can be analyzed by processor 118 to identify a bearing towards RF leak 104. In this case, a zero crossing point 1206 allows processor 118 to identify a bearing 1208 to RF leak 104 that may be orthogonal to a direction of travel 1210 of mobile device. Using multiple bearings as mobile device 100 travels in different directions, an intersection of the multiple bearings indicates to mobile device 100 a location of RF leak 104.

Figure 14:
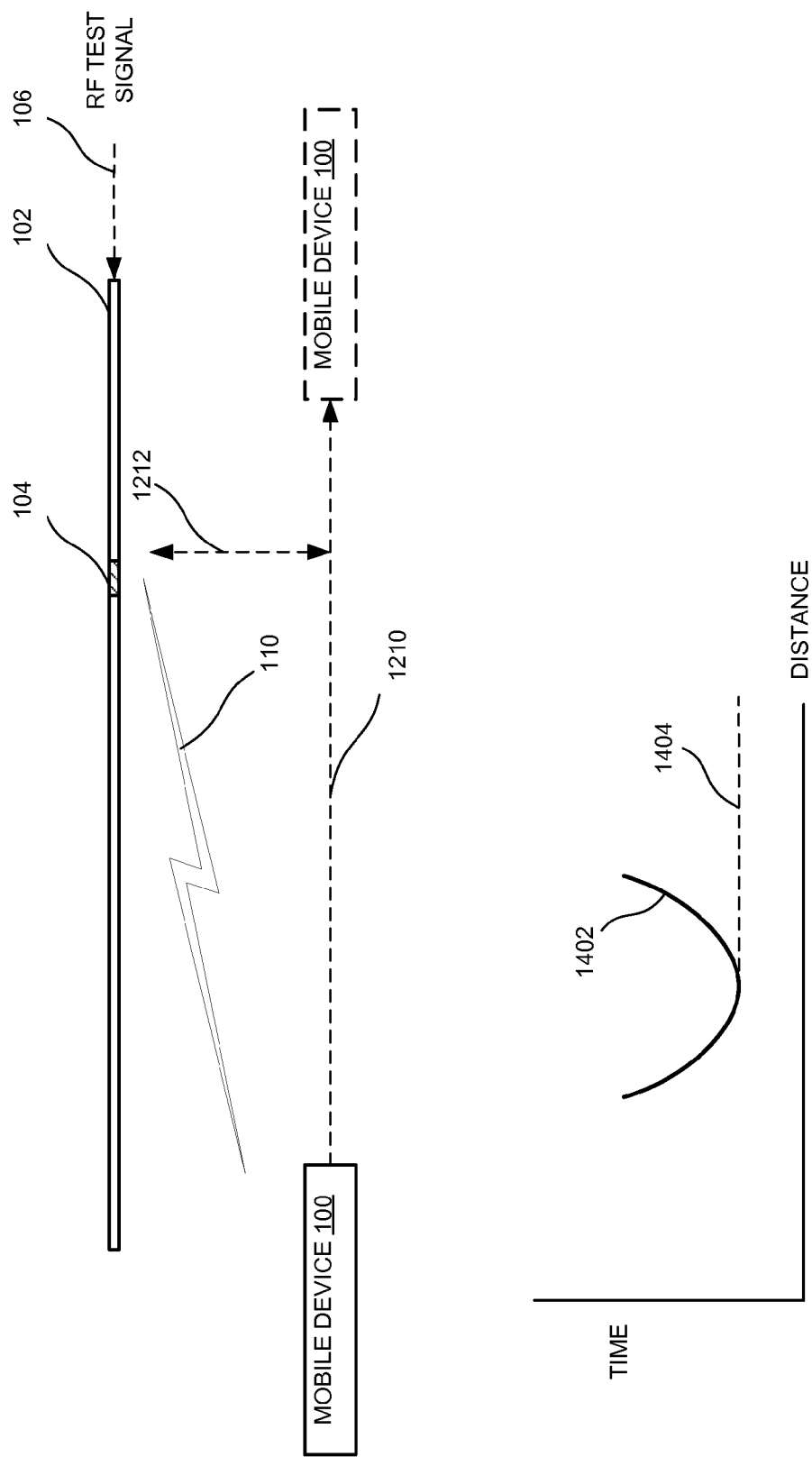
FIG. 14 is a block diagram of the mobile device of FIG. 1 in another exemplary embodiment.

FIG. 14 is a block diagram of mobile device 100 in another exemplary embodiment. In this embodiment, mobile device 100 is able to identify a location of RF leak 104 by analyzing an absolute delay between the transmission of RF test signal 106 and the reception of RF signal 110 by mobile device. As antenna 108 of mobile device 100 is brought closer to RF leak 104, a phase angle 1402 of RF signal 110 decreases to a minimum value at point 1404, which indicates that antenna 108 of mobile device 100 is proximate to RF leak 104.

Figure 15:
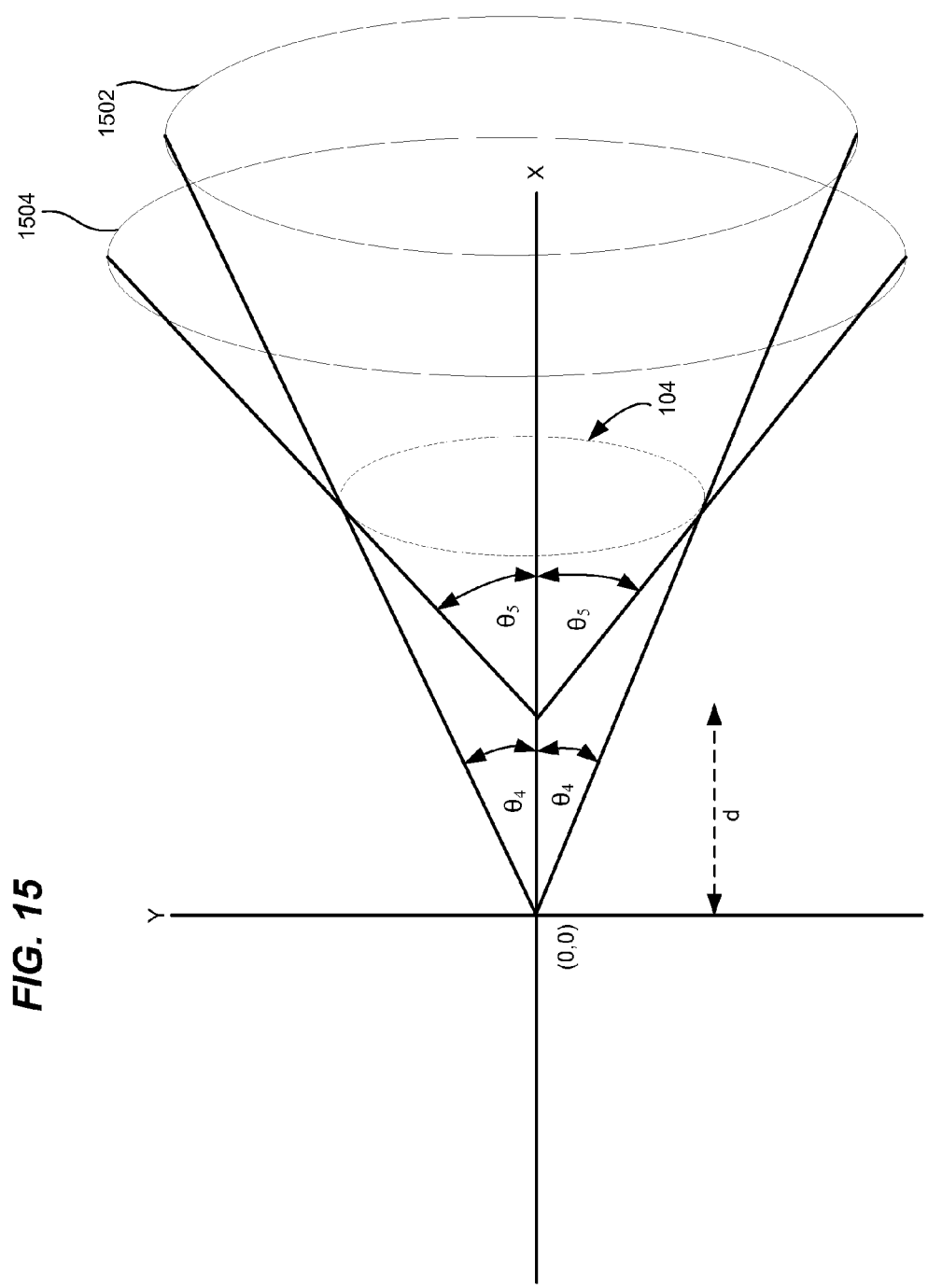
FIG. 15 illustrates spatial cones that are not located at the origin in an exemplary embodiment.

In another embodiment, mobile device 100 is capable of detecting information about RF leaks utilizing multiple spatial cones that are not located at the origin, which is illustrated in FIG. 15. In this embodiment, spatial cone 1502 is located along the y-axis, and spatial cone 1504 is located along the x-axis. However, spatial cone 1504 is not located at the origin (0,0) in this embodiment. Rather, spatial cone 1504 is located some distance (d) along the x-axis from the origin, which places a location of RF leak 104 somewhere on a circle that is created when spatial cone 1502 intersects spatial cone 1504. In this embodiment, $\theta_4$ and $\theta_5$ are different angles.

As discussed previously, an accurate source clock onboard mobile device 100 may be utilized in order to accurately identify subtle changes in the phase angle and/or the frequency of RF signal 110. One of the challenges in leakage detection is the use of a very stable reference signal source. This may be provided by using a Rubidium-based or Cesium-based frequency standard, which are commercially available. Another approach is the use a GPS-referenced clock.

These challenges may be mitigated by transmitting an RF test signal with a built-in reference. One option includes the use of two CW RF test signals separated by a fixed frequency, such as 10 MHz. Other options include the use of modulation, such as Amplitude Modulation (AM) or Binary Phase Shift Keying (BPSK), or downstream DOCSIS® 3.1 signals which can have a bandwidth nearing 200 MHz.

At mobile device 100, the RF signals could be demodulated to derive the clock, which would be used to as a reference for mobile device 100. If two tones were used, they could be mixed together to produce a lower stable reference. The current Ettus B200 Software Defined Radio (SDR) receiver uses a 10 MHz reference. The recovered symbol clock or difference frequency can be used to lock-up a phased lock loop (PLL) generating a stable 10 MHz.

Using RF test signals with a built-in reference works even when there is Doppler shift, because the frequency of the modulation is not strongly affected by Doppler. Instead, the center frequency will be affected. Ideally you want the modulated signal, or two CW RF test signals, to be close enough in frequency to have very similar transmission path characteristics. One possible range for the recovered clock is 0.1-200 MHz. After recovering a stable clock, either or both tones can be demodulated into IQ data samples. The stable clock may also be derived from a data signal, such as a DOCSIS 3.1 OFDM® downstream signal.

A problem arises when there is more than one signal source, or one signal source is reflecting and producing multipath. In this RF environment the trajectory of the IQ plot is no longer circular, but appears to move randomly, sometimes temporarily passing through the origin at a location where all received signals cancel due to vector phase addition or subtraction. The presence of multiple sources and be detected by measuring and saving IQ values at uniform distances while the antenna is traveling in a straight line. Mobile device 100 may perform Fourier transform such as a Discrete Fourier Transform (DFT) or a FFT on saved IQ data 114 to generate transformed data, which may reveal if multiple RF leaks or reflections are present. Ideally the samples are evenly spaced and the numbers of samples is 2 raised to an integer power, and all sample locations taken while antenna 108 is traveling in a straight line. Optionally the set of samples may be windowed to reduce a characteristic called leakage. After windowing the data set is transformed using a DFT. The data are analyzed and more data is gathered. If, for example a 64 point Fourier transform is being performed, a smoother display can be obtained by replacing some of the older samples with newer samples. Use of a windowing technique before performing a Fourier transform reduces leakage and produces clearer peaks in the transform. This test method may be viewed as a type of synthetic phased array.

Utilizing the various analytical techniques described, locating and mitigating RF leaks in coaxial cables of a cable plant can be performed more quickly and efficiently. This allows the cable operator of the cable plant to unsure that the RF leakage levels enforced by the FCC are in compliance.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Figure 16:
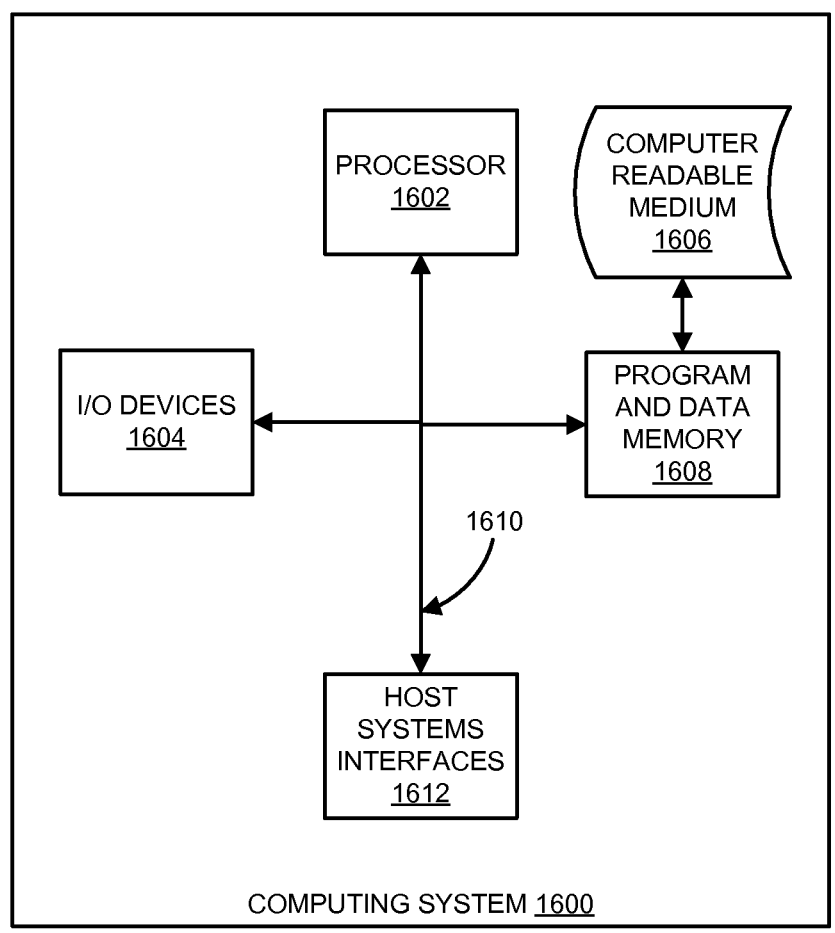
FIG. 16 is a block diagram of an exemplary computing system in which a computer readable medium provides instructions for performing the methods described herein.

In one embodiment, the invention is implemented in software, which includes but is not limited to firmware, resident software, microcode, etc. FIG. 16 illustrates a computing system 1600 in which a computer readable medium 1606 may provide instructions for performing any of the methods disclosed herein.

Furthermore, the invention can take the form of a computer program product accessible from the computer readable medium 1606 providing program code for use by or in connection with a computer or any instruction execution system. For the purposes of this description, the computer readable medium 1606 can be any apparatus that can tangibly store the program for use by or in connection with the instruction execution system, apparatus, or device, including the computer system 1600.

The medium 1606 can be any tangible electronic, magnetic, optical, electromagnetic, infrared, or semiconductor system (or apparatus or device). Examples of a computer readable medium 1606 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 1600, suitable for storing and/or executing program code, can include one or more processors 1602 coupled directly or indirectly to memory 1608 through a system bus 1610. The memory 1608 can include local memory employed during actual execution of the program code, bulk storage, and cache memories which provide temporary storage of at least some program code in order to reduce the number of times code is retrieved from bulk storage during execution. Input/output or I/O devices 1604 (including but not limited to keyboards, displays, pointing devices, etc.) can be coupled to the system either directly or through intervening I/O controllers. Network adapters may also be coupled to the system to enable the computing system 1600 to become coupled to other data processing systems, such as through host systems interfaces 1612, or remote printers or storage devices through intervening private or public networks. Modems, cable modem and Ethernet cards are just a few of the currently available types of network adapters.

Although specific embodiments were described herein, the scope is not limited to those specific embodiments. Rather, the scope is defined by the following claims and any equivalents thereof.

The invention claimed is:

1. A mobile device configured to detect Radio Frequency (RF) leaks emanating from a coaxial cable of a cable plant, the mobile device comprising:

an antenna configured to receive an RF signal from an RF leak in the coaxial cable;
a quadrature demodulator configured to demodulate the RF signal to generate In-phase and Quadrature (IQ) data; and
a controller configured to determine changes in a phase angle of the RF signal based on the IQ data generated as the mobile device is in motion, and to:
identify that the mobile device is traveling towards the RF leak responsive to determining that the phase angle is advancing; and
identify that the mobile device is traveling away from the RF leak responsive to determining that the phase angle is retarding.

2. The mobile device of claim 1 further comprising:
a display;
wherein the controller is further configured to:
indicate on the display that that the mobile device is traveling towards the RF leak responsive to determining that the phase angle is advancing; and
indicate on the display that the mobile device is travelling away from the RF leak responsive to determining that the phase angle is retarding.

3. The mobile device of claim 1 wherein:
the controller is further configured to determine a first phase angle of the RF signal based on the IQ data generated at a first location of the mobile device, to determine a second phase angle of the RF signal based on the IQ data generated at a second location of the mobile device, and to calculate a first apex angle based on a phase difference between the first phase angle and the second phase angle and a distance between the first location and the second location, wherein the first apex angle defines a first spatial cone along a first axis that constrains possible locations of the RF leak along a surface of the first spatial cone.

4. The mobile device of claim 3 wherein:
the controller is further configured to determine a third phase angle of the RF signal based on the IQ data generated at a third location of the mobile device, and to calculate a second apex angle based on a phase difference between the first phase angle and the third phase angle and a distance between the first location and the third location, wherein the second apex angle defines a second spatial cone along a second spatial axis that is orthogonal to the first spatial axis, wherein the second spatial cone constrains possible locations of the RF leak along a surface of the second spatial cone;
the controller is further configured to determine a fourth phase angle of the RF signal based on the IQ data generated at a fourth location of the mobile device, and to calculate a third apex angle based on a phase difference between the first phase angle and the fourth phase angle and a distance between the first location and the fourth location, wherein the third apex angle defines a third spatial cone along a third spatial axis that is orthogonal to the first spatial axis and the second spatial axis, wherein the third spatial cone constrains possible locations of the RF leak along a surface of the third spatial cone; and
the controller is further configured to determine a bearing of the RF leak based on an intersection of the first spatial cone, the second spatial cone, and the third spatial cone.

5. The mobile device of claim 1 further comprising:
a member configured to rotate about an axis;
wherein the antenna is mounted to the member at a radius from the axis; and
wherein the controller is further configured to determine a maximum rate of change in a phase angle of the RF signal based on the IQ data generated as the antenna rotates about the axis, and to determine a bearing of the RF leak based on a position of the antenna at the maximum rate of change.

6. The mobile device of claim 1 wherein:
the controller is further configured to perform an Inverse Fast Fourier Transform (IFFT) on the IQ data to generate IFFT data, and to determine if at least two RF sources are indicated in the IFFT data; and
the controller, responsive to determining that at least two RF sources are indicated, is further configured to determine if a phase angle of each of the at least two RF sources correspond as the mobile device changes locations, and to:
identify that at least two RF leaks exist in the coaxial cable responsive to determining that the phase angle of each of the at least two RF sources do not correspond as the mobile device changes locations; and
identify that one RF leak exists in the coaxial cable responsive to determining that the phase angle of each of the at least two RF sources correspond as the mobile device changes locations.

7. A method for detecting Radio Frequency (RF) leaks emanating from a coaxial cable of a cable plant, the method comprising:
receiving, by an antenna of a mobile device, an RF signal from an RF leak in the coaxial cable;
demodulating the RF signal to generate In-phase and Quadrature (IQ) data;
determining changes in a phase angle of the RF signal based on the IQ data generated as the mobile device is in motion;
identifying that the mobile device is traveling towards the RF leak responsive to determining that the phase angle is advancing; and
identifying that the mobile device is traveling away from the RF leak responsive to determining that the phase angle is retarding.

8. The method of claim 7 further comprising:
indicating on a display of the mobile device that the mobile device is travelling towards the RF leak responsive to determining that the phase angle is advancing; and
indicating on the display that the mobile device is travelling away from the RF leak responsive to determining that the phase angle is retarding.

9. The method of claim 8 further comprising:
determining a first phase angle of the RF signal based on the IQ data generated at a first location of the mobile device;
determining a second phase angle of the RF signal based on the IQ data generated at a second location of the mobile device; and
calculating a first apex angle based on a phase difference between the first phase angle and the second phase angle and a distance between the first location and the second location, wherein the first apex angle defines a first spatial cone along a first spatial axis that constrains possible locations of the RF leak along a surface of the first spatial cone.

10. The method of claim 9 further comprising:

determining a third phase angle of the RF signal based on the IQ data at a third location of the mobile device;

calculating a second apex angle based on a phase difference between the first phase angle and the third phase angle and a distance between the first location and the third location, wherein the second apex angle defines a second spatial cone along a second spatial axis that is orthogonal to the first spatial axis, wherein the second spatial cone constrains possible locations of the RF leak along a surface of the second spatial cone;

determining a fourth phase angle of the RF signal based on the IQ data generated at a fourth location of the mobile device;

calculating a third apex angle based on a phase difference between the first phase angle and the fourth phase angle and a distance between the first location and the fourth location, wherein the third apex angle defines a third spatial cone along a third spatial axis that is orthogonal to the first spatial axis and the second spatial axis, wherein the third spatial cone constrains possible locations of the RF leak along a surface of the third spatial cone; and identifying a bearing of the RF leak based on an intersection of the first spatial cone, the second spatial cone, and the third spatial cone.

11. The method of claim 8 further comprising:

rotating the antenna about an axis;

determining a maximum rate of change in a phase angle of the RF signal based on the IQ data generated as the antenna rotates about the axis; and determining a bearing of the RF leak based on a position of the antenna at the maximum rate of change.

12. The method of claim 8 further comprising:

performing an Inverse Fast Fourier Transform (IFFT) on the IQ data to generate IFFT data;

determining if at least two RF sources are indicated in the IFFT data;

determining, responsive to at least two RF sources indicated, if a phase angle of each of the at least two RF sources correspond as the mobile device changes locations;

identifying that at least two RF leaks exist in the coaxial cable responsive to determining that the phase angle of each of the at least two RF sources do not correspond as the mobile device changes locations; and identifying that one RF leak exists in the coaxial cable responsive to determining that the phase angle of each of the at least two RF sources correspond as the mobile device changes locations.

13. A non-transitory computer readable medium embodying programmed instructions which, when executed by a processor of a mobile device, detect Radio Frequency (RF) leaks emanating from a coaxial cable of a cable plant, the instructions directing the processor to:

receive, by an antenna of the mobile device, an RF signal from an RF leak in the coaxial cable;

demodulate the RF signal to generate In-phase and Quadrature (IQ) data;

determine changes in a phase angle of the RF signal based on IQ data generated as the mobile device is in motion;

identify that the mobile device is traveling towards the RF leak responsive to determining that the phase angle is advancing; and identify that the mobile device is traveling away from the RF leak responsive to determining that the phase angle is retarding.

14. The non-transitory computer readable medium of claim 13 wherein the instructions further direct the processor to:

indicate on a display of the mobile device that the mobile device is travelling towards the RF leak responsive to determining that the phase angle is advancing; and indicate on the display that the mobile device is travelling away from the RF leak responsive to determining that the phase angle is retarding.

* * * * *